May 3, 1960 S. J. LANDSBERG 2,935,693
STABILIZED DIRECT AND ALTERNATING VOLTAGE
AMPLIFIER CIRCUIT ARRANGEMENT
Filed May 25, 1956 2 Sheets-Sheet 1

INVENTOR
Samuel Jacob Landsberg
BY
Fred M. Vogel
AGENT

INVENTOR
Samuel Jacob Landsberg
BY Fred M. Vogel
AGENT 2,935,693
Patented May 3, 1960

2,935,693

STABILIZED DIRECT AND ALTERNATING VOLTAGE AMPLIFIER CIRCUIT ARRANGEMENT

Samuel Jacob Landsberg, Eindhoven, Netherlands, assignor, by mesne assignments, to North American Philips Company, Inc., New York, N.Y., a corporation of Delaware Application May 25, 1956, Serial No. 587,363

Claims priority, application Netherlands April 19, 1956

3 Claims. (Cl. 330—9)

The present invention relates to a direct and alternating voltage amplifier circuit arrangement, i.e. to an amplifier circuit arrangement which is capable of amplifying and reproducing both alternating and direct voltages.

There are two essentially different kinds of such amplifying arrangements. One kind comprises a conductively coupled amplifier and has the disadvantage that, at least with comparatively high amplification, it is extremely difficult to stabilize the output voltage supplied by the amplifier at a given input voltage.

The other kind of amplifying arrangement comprises a mechanical or electrical control means or converter, by which a direct input voltage is converted into an alternating voltage of determined frequency. The alternating voltage thus obtained is applied to the input of a conventional alternating-voltage amplifier, amplified by the latter and then rectified. In order to obtain a direct output voltage of a polarity which corresponds to that of the input voltage, use is then preferably made of synchronous or phase-dependent rectification and the components of converter frequency or of a frequency related thereto are filtered out of the rectified voltage by means of a low pass filter.

With this kind of amplifying arrangement, the difficulties encountered in stabilizing the output voltage are reduced. The frequency of the alternating voltages that can be amplified is, however, limited by the frequency of the control means or converter and must be at least an order of magnitude smaller than the latter. The converter frequency is itself limited, for example, by mechanical difficulties.

If the output voltage of a conductively coupled amplifier is stabilized by means of a negative feedback, the amplification of the arrangement is reduced to the same extent as the unstability of the output voltage.

For particular purposes, especially for electronic analogue computers, this difficulty has been overcome by rendering the feedback factor for the unwanted output-voltage variations higher than that for the effective output voltage. This is obtained by converting the sum of the input voltage and the feedback voltage into an alternating voltage, by amplifying the latter in an A.C. amplifier and by subsequently rectifying it. The rectified output voltage of the A.C. amplifier is then smoothed to remove the components of converter frequency and fed back in the counteracting direction into the conductively coupled amplifier. In order to avoid unwanted influence on the output voltage of the amplifier circuit arrangement, care must be taken that the input voltage supplied to the A.C. amplifier does not contain components of converter frequency, and in order to prevent the occurrence of an interfering output signal, the A.C. amplifier must produce a considerable attenuation at the converter frequency. For direct voltages and alternating voltages with a frequency much lower than the converter frequency which are eventually produced in the conductively coupled amplifier, i.e., for the unwanted output-voltage variations, the amplifier arrangement has a negative feedback factor which exceeds the negative feedback factor of the conductively coupled amplifier by an amount equal to the amplification factor of the A.C. amplifier, so that the output-voltage variations are reduced to an extent corresponding to this amplification factor.

For satisfactory operation of such an amplifier circuit arrangement, the conductively coupled amplifier should operate with a very high negative feedback factor, so that the voltage applied to the converter contains only a comparatively smal input-voltage component. Furthermore, in the frequency range in which the transmission via the loop comprising the converter, the A.C. amplifier and the rectifier decreases, the conductively coupled amplifier should have a substantially flat frequency response curve, since, if at a given frequency the sum of the respective phase shifts of the said loop and of the conductively coupled amplifier were more than 180°, self-oscillation could be produced by feedbcak via the said loop.

Moreover, the amplification A of the circuit arrangement varies with the input impedance $Zi$ viewed from the negative feedback connection between the output and the input of the conductively coupled amplifier and with the impedance $Zf$ of this connection $$\left(A \simeq \frac{Zf+Zi}{Zi}\right)$$

In a known embodiment of such an arrangement, $Zi$ is constituted by the series combination of an input resistor $Ri$ and of the internal impedance $Zs$ of the input voltage source, so that a strong variation of A with $Zs$ is unavailable, unless $Zs$ remains much smaller than $Zi$. In order to avoid this disadvantage, the input voltage and the negative feedback voltage should be supplied in series to the input terminals of the conductively coupled amplifier. With respect to the "ground" of the amplifiers, one of the input terminals of the circuit arrangement would then exhibit a voltage difference equal to the negative feedback voltage, and this could also be highly inconvenient. Consequently, such amplifying circuits are unsuitable for many purposes, for example, for the amplification of voltages supplied by sources with different and sometimes high internal impedances, and more particularly for measuring purposes.

The invention has for its object to provide a direct and alternating voltage amplifier circuit arrangement with stabilized output voltage, in which the aforesaid disadvantages are eliminated and the transmission properties of which are independent of the means used for stabilizing the output voltage.

The circuit arrangement of the present invention comprises a conductively coupled main amplifier and means for stabilizing the output voltage thereof. In accordance with the invention, a fourth voltage derived from the output or third voltage of the amplifier is periodically compared with a second voltage derived from the input or first voltage thereof, so as to produce a correction signal or fifth voltage substantially proportional to the drift component of the output or third voltage of the main amplifier. The correction signal or fifth voltage is amplified in an alternating voltage amplifier and rectified. The amplified drift or sixth voltage thus obtained is fed to the main amplifier with the required polarity, so that the said drift component is reduced substantially proportionally to the amplification factor of the alternating voltage amplifier.

Since in the production of the correction signal or fifth voltage the input signal component of the fourth voltage derived from the output signal or third voltage is substantially compensated by the second voltage derived from the input signal or first voltage, the correction signal or fifth voltage is substantially free of input signal components. Therefore, on the one hand, the amplification factor of the A.C. amplifier is not restricted by the properties of the main amplifier, while on the other hand the transmission properties of the complete amplifier circuit arrangement are independent from the means for stabilizing the output voltage.

In order that the invention may be readily carried into effect, it will now be described with reference to the accompanying drawing, in which.

Figure 1:
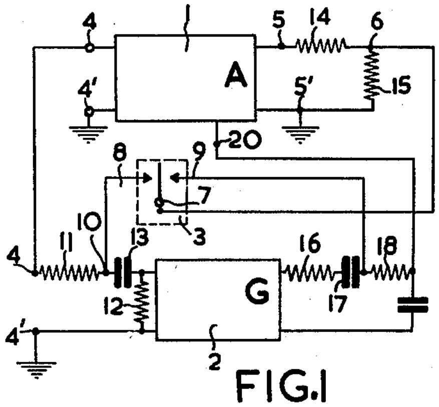
Fig. 1 is a schematic block diagram of an embodiment of the circuit arrangement of the present invention.

As is shown in the block diagram of Fig. 1, the direct and alternating voltage amplifier circuit arrangement comprises a conductively coupled main amplifier 1, with an amplification factor A, and means to stabilize the output or third voltage of said amplifier. These means comprise an A.C. amplifier 2 and control means 3 which may comprise a throw-over switch or commutator, operating with a determined frequency $f_o$. The input terminals 4, 4' are on the one hand directly connected to the input of the main amplifier 1 and, on the other hand, via an input network consisting of a series resistor 11, a series capacitor 13 and a parallel resistor 12, to the input terminals of the A.C. amplifier 2. A voltage divider comprising two resistors 14 and 15 is connected to the output terminals 5, 5' of the main amplifier and of the circuit arrangement. The tapping point 6 of the voltage divider 14, 15 is connected to the movable contact 7 of the commutator 3. The commutator 3 is provided with two stationary contacts 8 and 9. The contact 8 is connected to the junction 10 of the resistor 11 and of the capacitor 13. A smoothing network comprising a series-resistor 18 and a parallel-capacitor 19 is connected to the output terminals of the A.C. amplifier 2 via a series-resistor 16 and a separation capacitor 17. The junction of the capacitor 17 and of the resistor 18 is connected to the contact 9 of the commutator 3 and the junction of the series resistor 18 and of the parallel capacitor 19 is connected to a terminal 20 of the main amplifier 1.

The commutator 3 may be driven by an electromagnet (not shown), so that its contact 7 alternately engages the contacts 8 and 9. The input voltage $e_i$ supplied between the terminal 10 and ground via the resistor 11 is thus periodically compared with a determined part of the output voltage $e$. Moreover, the junction of the capacitor 17 and of the resistor 18 is periodically grounded via the small resistor 15, so that a synchronous rectification of the output voltage of the A.C. amplifier 2 takes place. The rectified output voltage is applied between a terminal 20 of the main amplifier 1 and ground via the smoothing network consisting of the resistor 18 and the capacitor 19.

The output voltage $e_o$ of the main amplifier 1 and of the amplifier circuit arrangement contains, as that of any conductively coupled amplifier, a certain drift-voltage component, i.e. a voltage component varying with time, with the ambient temperature, the age of the amplifying elements employed and with the supply voltages. This may be very inconvenient, for example, for measuring purposes.

An important part of this drift voltage is produced in the first stage of the main amplifier and is amplified by the following stages. The output voltage $e_o$ is equal to the input voltage $e_i$ plus the input voltage of the main amplifier corresponding to the drift voltage, multiplied by the amplification factor A of said amplifier:

$$e_o = A(e_i + e_d)$$

Consequently a voltage $$A(e_i + e_d)\frac{R15}{R14+R15}$$

is produced between ground and the terminal 6. The resistors 14 and 15 are chosen such that this voltage is equal to $e_i+e_d$, i.e. that $$\frac{R14+R15}{R15} = A$$

As long as no contact is established between the contacts 7 and 8 of the control means 3, the voltage between the terminal 10 and ground is substantially equal to the input voltage $e_i$. By establishing a periodical contact between this pair of contacts, the part $e_i+e_d$ of the output voltage is compared with the input voltage $e_i$. The difference $e_d$ between these two voltages periodically produces a corresponding current through the capacitor 13 and the resistor 12, so that a correction signal or fifth voltage is applied to the input terminals of the A.C. amplifier. The amplitude of said correction signal is proportional to the drift component $e_d$ of the output voltage of the main amplifier. Said correction signal is amplified by the A.C. amplifier and rectified by means of the pair of contacts 7 and 9. The rectified or sixth voltage applied between the terminal 20 of the main amplifier 1 and ground is consequently also proportional to the drift component $e_d$ of said amplifier. It is fed to the main amplifier with such polarity that it counteracts the drift voltage $e_d$. Thus, the drift component $e_d$ of the main amplifier is reduced substantially proportionally to the amplification factor G of the A.C. amplifier 2. The terminal 20 may be connected to a point of the main amplifier, after which said main amplifier provides an important amplification ($A_o$). In this case the drift component is reduced by a factor $$1+G\frac{A_o}{A}$$

wherein $A_o$ may at the most be equal to A.

The smoothing network 18, 19 suppresses the alternating voltage components of the amplified and rectified correction signal or sixth voltage and, more particularly, the components with the fundamental frequency $f_o$. The time constant R18–C19 of this network is therefore chosen very high with respect to the working period $1/f_o$ of the control means or converter, for example, a few thousand times $1/2\pi f_o$.

The means for stabilizing the output voltage of the amplifier circuit arrangement described thus operate as a voltage regulator controlling an output voltage with respect to a reference voltage, the input voltage applied to the amplifier circuit arrangement being employed as a reference voltage. Moreover the stability of the loop from the terminal 5 via the control means or commutator 3 and the A.C. amplifier 2 to the terminal 20 and via part of the main amplifier 1 back to the terminal 5 is independent of the properties of the part of the main amplifier connected between the input and the terminal 20. The main amplifier may therefore have a very large bandwidth F and a very high amplification factor A, whereby the product $A \times F$ is not restricted by the means for stabilizing the output voltage. On the other hand, use may easily be made of a converter with a considerably higher working frequency, whereby the output voltage is also stabilized with respect to rapid and/or short drift voltage components.

If the required amplification is very high and/or the requirements of stability of the output voltage of the amplifier circuit arrangement are very severe, interfering effects may give rise to some difficulties.

Incidental variations of the input voltage may reach the input terminals of the A.C. amplifier via the resistor 11 and the capacitor 13, or via the main amplifier, the voltage-divider 14, 15, the commutator 3 and the capacitor 13. If the variations of the two voltages to be compared by the control means or commutator 3 produced by these variations are not identical and in phase, they produce variations of the correction signal produced by this comparison and result in objectionable variations of the output voltage of the amplifier circuit arrangement. Whether identical and in phase or not, the variations of the voltages to be compared are, moreover, superimposed on the correction signal and hence amplified therewith by the A.C. amplifier. If the said variations contain components of very low frequency, these are converted by the commutator into pulses of the working frequency $f_0$ thereof, rectified by the same commutator after having been amplified by the A.C. amplifier, attenuated and delayed by the smoothing network 18, 19, and reach the terminal 20 with a phase shift varying according to their frequency, so that they produce a distortion of the frequency response curve of the circuit arrangement in the low-frequency range. Components with a frequency equal to the working frequency $f_0$ of the converter or to an odd harmonic thereof are rectified and may thus produce a variation of the direct voltage applied to the terminal 20, so that the output voltage is adversely affected thereby. Furthermore, an abrupt step of the input voltage may reach the input terminals of the A.C. amplifier. If no particular precautions have been taken, such a step reaches the terminal 6 substantially unchanged, as indicated by the line $e_6$ of Fig. 2. However, it is distorted by the input network 11, 13, 12 with the time constant T and reaches the terminal 10 in the shape shown by the curve $e_{10}$ of Fig. 2. A voltage difference $e_6—e_1$, (Fig. 2) derived from the input voltage is thus present across the pair of contacts 7 and 8. During the periodical closure of the pair of contacts 7 and 8, this voltage difference produces corresponding current pulses across the capacitor 13 and the resistor 12 and corresponding voltage pulses across the input of the A.C. amplifier. After amplification and rectification, these pulses are integrated by the smoothing network 18, 19 and produce a variation of the voltage applied to the terminal 20 and an unwanted variation of the output voltage. This difficulty is avoided if care is taken that the voltage step at the terminal 6 is of the same shape amplitude and phase as the voltage step at the terminal 10. The common voltage step is then, however, differentiated by the RC-network 13, 12 so that it assumes substantially the shape indicated by the curve $e_g$ of Fig. 2. This step is superimposed on the correction signal and amplified together therewith by the A.C. amplifier. If the input voltage steps are aperiodical, or if their repetition frequency is lower than the working frequency $f_0$ of the converter, they are at least partly rectified and they produce a small variation of the output voltage, which may be objectionable.

Figure 3:
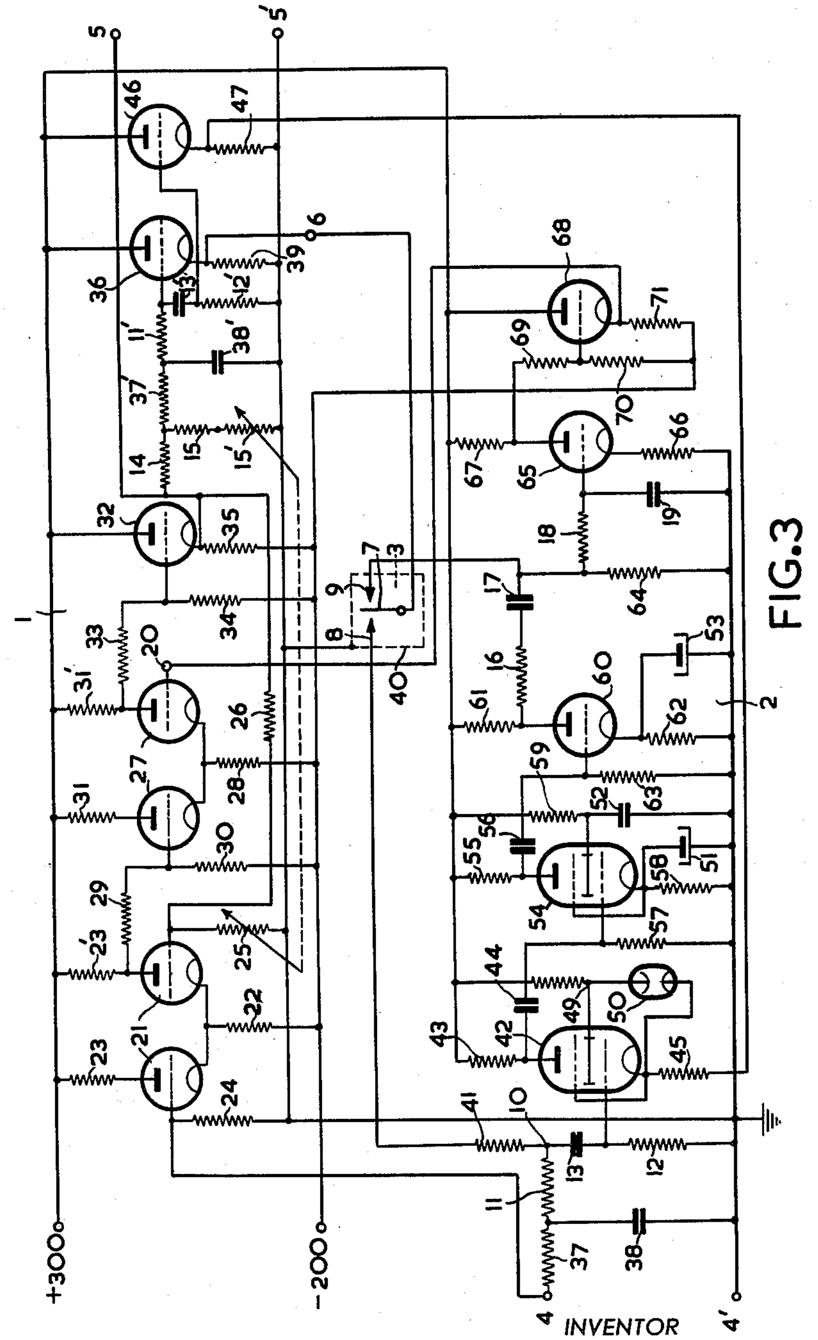
Fig. 3 is a schematic circuit diagram of an embodiment of the circuit arrangement of the present invention.

In the embodiment shown in Fig. 3 measures are taken to avoid or to compensate the interfering effects described. Fig. 3 is a schematic circuit diagram of an embodiment of the circuit arrangement of the present invention. The circuit arrangement of Fig. 3 is one which may be utilized in the blocks of Fig. 1 to perform the described functions of the circuit arrangement of Fig. 1. In Fig. 3, corresponding parts are designated by the same reference numerals as in the block diagram of Fig. 1.

In Fig. 3, the conductively coupled main amplifier 1 consists of two amplifying stages and of three stages in grounded anode connection, or cathode-followers. The input stage has a double triode 21, the two triodes of which are intercoupled by means of a cathode resistor 22. The two anodes are each connected through a load resistor 23 and 23′, respectively, to the positive terminal of a high-voltage supply source, of for example 300 volts, while the cathode resistor 22 is connected to the negative terminal of a supply source, of for example 200 volts. The control-grid of the left-hand part of the double triode 21 is connected directly to the input terminal 4. Through a grid leak resistor 24, this grid is also connected to the grounded input terminal 4′. The first or input voltage is applied to the grid of the left triode 21. The grid of the right-hand part of the double triode 21 is connected to ground via a variable resistor 25 and to the output terminal 5 via a negative feedback resistor 26. The second stage of the main amplifier has a double triode 27 with a common cathode resistor 28 connected to the —200 volt terminal. The grid of the left hand part of the double triode 27 is conductively coupled to the anode of the right hand part of the double triode 21 by means of a voltage divider, consisting of resistors 29 and 30, the resistor 30 being connected to the —200 volt terminal. The anodes of the two triodes of the double triode 27 are connected to the +300 volt terminal via load resistors 31 and 31′, respectively. The grid of the right hand triode of the second stage corresponds to the terminal 20 of the block diagram of Fig. 1 and is directly connected to the cathode of an output cathode-follower 68, 71 of the alternating voltage amplifying means or A.C. amplifier. A first cathode-follower comprises a triode 32, the anode of which is directly connected to the +300 volt terminal. The first cathode follower functions as amplification control means. The grid of the triode 32 is conductively coupled to the anode of the right hand triode 27 of the second stage by means of a voltage divider consisting of two resistors 33 and 34, the resistor 34 being connected to the —200 volt terminal, and its cathode being connected to the —200 volt terminal via a load resistor 35. The cathode of the triode 32 is directly connected to the output terminal 5 and, via the resistor 26, to the grid of the right hand part of the double triode 21. The cathode of the triode 32 is also connected to one end of a voltage divider consisting of two fixed and one variable resistor 14, 15 and 15′, respectively. The voltage divider 14, 15, 15′ functions as variable voltage dividing means. One end of the variable resistor 15′ is connected to ground and an output network, through which the second and the third cathode-followers are driven, is connected to the junction of the fixed resistors 14 and 15. This output network comprises two series resistors 37′ and 11′, a first parallel capacitor 38′ and a second parallel element consisting of a capacitor 13′ in series with a resistor 12′. It is identical with the network connected between the input terminals 4, 4′ and the input of the A.C. amplifier. The anodes of the triodes 36 and 46 of the second and third cathode-followers, respectively, are connected directly to the +300 volt terminal and their cathodes are connected to ground via load resistors 39 and 47, respectively. The grids of the triodes 36 and 46 are respectively connected to the junction of the resistor 11′ and of the capacitor 13′ and to that of the capacitor 13′ and of the resistor 12′. The two variable resistors 25 and 15′ are mechanically coupled with one another.

The means for stabilizing the output voltage of the conductively coupled main amplifier described above comprise the control means or commutator 3 with the movable contact 7 and the two stationary contacts 8 and 9, the A.C. amplifier 2, rectifying and smoothing elements, a direct-current amplifying stage and the output cathode-follower stage. The commutator may be driven by an electromagnet (not shown) fed by an alternating current of determined frequency, so that the movable contact 7 alternately engages the two stationary contacts 8 and 9. The contacts are arranged in a screening box 40, which is connected to ground and which screens these contacts from electrostatic and electromagnetic influences. The working frequency $f_0$ of the commutator 3 may be of the order of 70 cycles per second. However, this working frequency could be raised materially, for example to a few hundred periods per second, to enable the rapid counteraction of variations of the output voltage of the amplifier circuit arrangement. The movable contact 7 of the commutator is connected to the cathode of the triode 36 and its fixed contact 8 is connected to the junction 10 of the resistor 11 and of the capacitor 13 through a series resistor 41. A second series resistor 37 is connected to the resistor 11 and the terminal 4 and these two resistors are of the same values as the resistors 37' and 11'. Their junction is connected to a smoothing capacitor 38, the other electrode of which is connected to ground. The value of the capacitor 38 is the same as that of the capacitor 38'. The capacitor 13 and the resistor 12 have the same values as the capacitor 13' and the resistor 12', respectively. The junction of the capacitor 13 and the resistor 12 is connected to the control-grid of an amplifying device or pentode 42. The pentode 42 constitutes the amplifying element of the first amplifying stage of the alternating voltage amplifying means or A.C. amplifier. The anode of the pentode 42 is connected to the +300 volt terminal through a load resistor 43 and to the control-grid of a second pentode 54 through a separation capacitor 44.

The cathode of the pentode 42 is connected to the cathode of the triode 46 of the third cathode follower of the main amplifier through a resistor 45 and its screen-grid is connected to the tapping point of a potentiometer consisting of a resistor 49 and a neon voltage stabilizer tube 50. The resistor 49 is connected to the +300 volt terminal and the tube 50 is connected to the cathode of the pentode 42. The anode of the pentode 54 of the second A.C. amplifying stage is connected to the +300 volt terminal through a load resistor 55 and to the control-grid of a triode 60 of a third A.C. amplifying stage through a separation capacitor 56. The control-grid of the pentode 54 is connected to ground through a leakage resistor 57 and its cathode is also connected to ground through a bias voltage resistor 58 shunted by a bypass capacitor 51, while its screen grid is fed from the +300 volt terminal through a series resistor 59 and is bypassed with respect to ground by a capacitor 52. The anode of the triode 60 is connected to the +300 volt terminal via a load resistor 61 and its cathode and grid are connected to ground through a bias-voltage resistor 62 shunted by a bypass capacitor 53 and through a leakage resistor 63, respectively. The anode of the triode 60 is connected to the stationary contact 9 of the commutator 3 and to the smoothing network 18, 19 through the series resistor 16 and the separation capacitor 17. A leakage resistor 64 is connected between ground and the contact 9. The control grid of a conductively coupled amplifying triode 65, included in a D.C. amplifying stage, is connected to the junction of the resistor 18 and of the capacitor 19 of the smoothing network. The cathode of the triode 65 is connected to ground through a bias voltage resistor 66 and its anode is connected to the +300 volt terminal through a load resistor 67. The grid of a cathode-follower triode 68 of the output cathode follower stage is conductively coupled to the anode of the triode 65 by means of a voltage divider consisting of resistors 69 and 70. The other end of the voltage divider 69, 70 is connected to the −200 volt terminal, to which the cathode of the triode 68 is connected via a load resistor 71. As stated above, the cathode of the triode 68 is directly connected to the grid of the right hand part of the double triode 27.

The first or input voltage is applied to the terminals 4 and 4' and is fed directly to the grid of the left hand triode 21 of the input stage of the main amplifier 1. The first voltage is also applied between grid and cathode of the right hand triode of the input stage through the cathode resistor 22. The first voltage is amplified in the triode 21 and, via the voltage divider 29, 30, the amplified voltage produced across the load resistor 23' is fed to the control-grid of the left hand triode 27 of the second stage of the main amplifier. By means of the common cathode resistor 28, the amplified voltage is applied between cathode and control grid of the right hand triode 27 of the second stage. The triode 27 again amplifies the amplified input voltage and the output voltage produced across the load resistor 31' of the second stage is fed to the control grid of the first cathode follower triode 32 through the voltage divider 33, 34. The third or output voltage of the main amplifier is obtained from the cathode of the triode 32. The third voltage is divided and smoothed and fed to the grid of the second cathode follower triode 36, via the voltage divider 14, 15, 15' and the output network 37', 38', 11', 13', 12'. The third or output voltage is also fed in a counteracting direction to the grid of the right hand triode of the double triode 21 via the series resistor 26. Together with the variable resistor 25, the resistor 26 constitutes a voltage divider, by means of which the negative feedback voltage and hence the amplification factor A of the main amplifier 1 can be varied. Thus, the circuit 32, 26, 25, 21 functions as amplification control means. The output network 37', 38', 11', 13', 12' and the variable voltage dividing means 14, 15, 15' function to derive a fourth voltage from the third voltage of the main amplifier. The third voltage is determined in accordance with the amplification factor of the main amplifier thereby producing substantially no variation of the zero output voltage of the main amplifier upon variation of the amplification factor thereof. The tube 36 of the second cathode follower stage functions to provide the fourth voltage, which appears across the output network. The fourth voltage is derived from the second cathode follower stage and is applied to the control means 3 through the terminal 6. The part of the output voltage fed to the movable contact 7 must be varied accordingly, so that this part remains always equal to $e_t+e_d$ and a variation of the amplification of the amplifier circuit arrangement produces practically no variation of the zero output voltage thereof. This is obtained by means of the mechanical coupling of the variable resistors 25 and 15'.

The values of the resistors 37 and 11 must be high, since the input network of the A.C. amplifier must produce a strong attenuation of the A.C. components. On the other hand, the values of the resistors 24 and 12 are restricted only by the properties of the tubes 21 and 42, respectively, so that the input resistance of the amplifier circuit arrangement may be very high. It should furthermore be noted that the input voltage source is not loaded by the commutator 3, since the input voltage $e_1$ is also present across the resistor 39, so that no input current flows through the resistors 37, 11 and 41 and the contacts 7 and 8 to the resistor 39 and ground. The direct-current input resistance of the circuit arrangement is, consequently, substantially equal to that of the grid-leak resistor 24.

Figure 2:
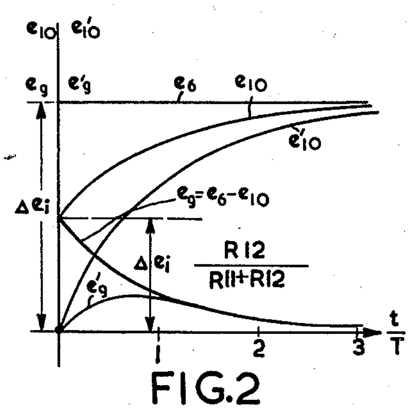
Fig. 2 is a graph illustrating the operation of the embodiment of Fig. 1.

The input network 37, 38, 11, 13, 12 functions to derive a second voltage from the first or input voltage. The input network serves two purposes. In the first place, it produces a material attenuation of the A.C. components of the first or input voltage reaching the input terminals of the A.C. amplifier. In the second place, it attenuates incidental currents with the working frequency $f_0$ flowing through the impedance of the input voltage source via the resistors 37 and 11, so that these currents produce practically no input voltage of corresponding frequency across the input terminals 4 and 4'. The time constant of this network must therefore be much higher than $$\frac{1}{\omega_0}=\frac{1}{2\pi f_0}$$

so that an incidental voltage step is delayed thereby according to the curve $e'_{10}$ of Fig. 2.

The control means 3 periodically compares the second and fourth voltages thereby to produce a fifth or resultant correction voltage. The fifth voltage is substantially proportional in magnitude to the drift component of the third voltage. Since the input and output networks have substantially equal frequency response characteristics, the second and fourth voltages are substantially in phase with each other and the amplitude of the fifth voltage is substantially independent of the first voltage.

The tube 46 of the third cathode follower stage functions to derive variations of the fourth voltage from the voltage across the circuit branch 13', 12' of the second cathode follower. The variations of the fourth voltage are derived from the third cathode follower stage and applied to the cathode of the pentode 42 through the resistor 45. The variations of the fourth voltage are applied to the cathode of the pentode 42 in counteracting direction with respect to variations of the fifth voltage. The fifth voltage is applied to the control grid of the pentode 42. Since the fifth voltage is applied to the control grid of the pentode 42 and the variations of the fourth voltage having the same polarity as and being proportional to said fifth voltage are applied to the cathode of said pentode, the application of the variations of the fourth voltage counteracts the control effect of the fifth voltage so that the alternating voltage amplifying means becomes substantially insensitive to the variations of the first voltage.

In order to avoid a variation of the sixth or control voltage applied to the terminal 20, the variations of the fourth voltage at the terminal 6 must be attenuated to the same extent as and be in phase with the remaining variations of the input voltage, which reach the terminal 10 through the input network 37, 38, 11, 13, 12. Consequently, the output network 37', 38', 11', 13', 12' is identical with the input network 37, 38, 11, 13, 12. As stated above, the smoothing network 18, 19 serves to suppress all alternating-voltage components of the amplified and rectified voltage. Its time constant is therefore chosen much higher than that of the input network 37, 38, 11, 13, 12.

An incidental input voltage step is materially attenuated by the networks 37, 38, 11, 13, 12 and 37', 38', 11', 13', 12' and it is differentiated by the part 13', 12' of the output network exactly in the same manner as by the corresponding part 13, 12 of the input network and approximately as indicated by the curve $e'_g$ of Fig. 2. This differentiated voltage step is simultaneously applied to the grid of the pentode 42 and, via the cathode-follower with the triode 46, to the cathode of said pentode. It is therefore not transmitted by the first stage of the A.C. amplifier and cannot affect the output voltage of the amplifier circuit arrangement. This compensation is further improved in that the potential of the screen grid of the pentode 42 is kept constant with respect to that of its cathode by means of the tube 50, so that, for example in the case of a positive voltage step, the potentials of the control-grid, of the cathode and of the screen-grid of this pentode vary simultaneously by the same amount in the positive direction.

With increasing frequency, the phase shift due to the output network 37', 38', 11', 13', 12' and to the part 13, 12 of the input network is smaller than or equal to −90° and the phase shift due to the smoothing network 18, 19 is substantially equal to −90°, so that the total phase shift across the loop formed by the part of the main amplifier following the terminal 20, the commutator 3, the A.C. amplifier, the rectifier and the direct-current amplifying stages with the triodes 65 and 68 is practically not larger than −180°. Under these conditions, self-oscillation caused by feedback over this loop cannot occur because the time constant of the smoothing network 18, 19 is much higher than that of the input and the output networks 37, 38, 11, 13, 12 and 37', 38', 11', 13' and 12'.

It is not necessary to stabilize the potential of the screen-grid of the pentode 42 with respect to that of its cathode, and slightly stronger alternating voltage components may just as well be fed to this cathode.

The sixth or amplified correction voltage is derived from the third A.C. amplifier stage of the alternating voltage amplifying means. The sixth voltage is rectified by application to a selected point of the control means 3. The rectified sixth voltage is applied to the selected point 20 of the main amplifier with a polarity opposed to that of the drift component whereby said drift component is reduced substantially proportionally to the amplification factor of the alternating voltage amplifying means.

The time constants of the input and output networks have a value which is large relative to the fundamental frequency of the fifth voltage. Thus the transmission of relatively rapid variations of the first voltage to the input of the alternating voltage amplifying means is reduced to a very small value and the transmission of the fifth voltage to the input of the main amplifier is reduced to a very small value.

The embodiment of Fig. 3 comprises, after the rectification of the sixth voltage from the output of the A.C. amplifier, a direct voltage amplifying stage and also a cathode-follower. This is not necessary, and the control-grid of the right hand triode of the double triode 27 could just as well be connected directly to the smoothing network 18, 19. The amplification of the A.C. amplifier however, cannot be made too large, and a fourth A.C. amplifying stage could give rise to difficulties, since the A.C. amplifier itself could become unstable, especially due to a small capacitative coupling between the fixed contacts 8 and 9. The direct-voltage amplifier 65—67 thus readily provides a further amplification of the rectified and smoothed sixth voltage or amplified correction signal and the cathode-follower 68—71 constitutes a convenient correction-voltage source of low output impedance.

The main amplifier and the A.C. amplifier of the embodiment described above are electron tube amplifiers. As a matter of course, the amplifier circuit arrangement according to the invention may comprise other amplifiers of any type and construction and, more particularly, transistor amplifiers, and practically any kind of direct-voltage amplifier may be stabilized in the manner described. A different kind of control means or converter could also be used, such as, for example, an electronic switch controlled by means of a source of light.

Figure 4:
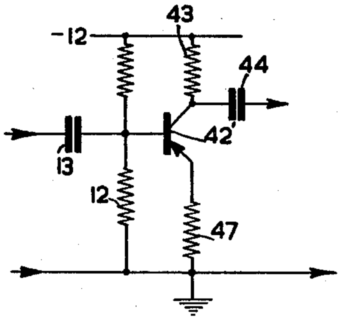
Fig. 4 is a modification of a portion of the embodiment of Fig. 3.

Fig. 4 shows a modification of the input stage of the A.C. amplifier. The amplifying element of the modificatiion is a PNP junction transistor 42' in grounded emitter connection, the resistor 47 across which an alternating voltage is fed back being connected between the emitter and ground. The desired negative bias voltage is applied to the base of the transistor through a resistor 72 connected to the negative terminal of a supply source of for example 12 volts. The collector of the transistor 42' is connected through the load resistor 43 to the −12 volt terminal and through the capacitor 44 to the control-electrode of the amplifying element of the next-following stage.

The current amplification of a junction transistor is substantially independent of the direct voltage applied between emitter and collector, so that it is sufficient to apply the fed-back alternating voltage components to the emitter of the transistor 42' in order to prevent or to reduce to a very large extent the transmission of these components through the A.C. amplifier.

Figure 5:
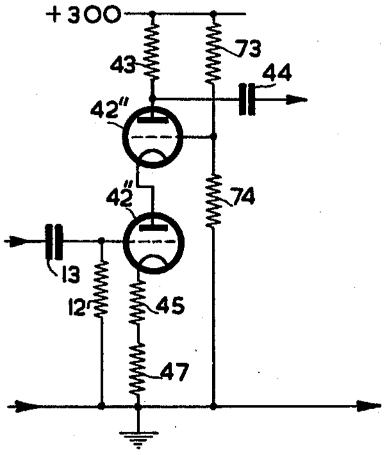
Fig. 5 is another modification of a portion of the embodiment of Fig. 3.

Fig. 5 is another modification of the input stage of the A.C. amplifier. In this modification, the pentode 42 is replaced by two triodes 42'' in cascode connection, whereby the control-grid of the second triode is kept at a constant potential by means of a voltage divider consisting of two resistors 73 and 74. A well known, particular property of the cascode circuit is that the potential of the anode of the first triode is kept substantially constant with respect to that of its cathode by the second triode. It is therefore sufficient to apply the fed-back alternating-voltage components to the cathode of the first triode in order to prevent the A.C. amplifier from transmitting these components.

In a practical embodiment of the amplifier circuit arrangement of the present invention, each of the double triodes 21 and 27 were replaced by two pentodes and the coupling resistors 30 and 34 were replaced by triodes, the cathode-anode path of which formed a two terminals constant current network. The working frequency $f_0$ of the commutator 3 was 70 cycles per second and the time constants of the output and input networks and of the smoothing network were 0.15 second and 40 seconds respectively. All resistors were usual resistors with a tolerance of $\pm5\%$, or even $\pm10\%$, and the heaters of all tubes were fed directly with 50 cycles per second alternating current by means of ordinary transformers.

With the above-described amplifier circuit arrangement, after a heating up period of one minute, and during a period of more than 5 hours, the mean drift or variation of the output voltage was found to be smaller than that corresponding to a variation of 10 microvolts of the input-voltage with short variations with an amplitude of 50 microvolts. The stability of the circuit arrangement with different direct voltage inputs was excellent and the hum voltage with short-circuited input was lower than 5 microvolts. The maximum amplification factor was 8000 times, or 16000 times with push-pull output, and the maximum output voltage was equal to 100 volts or twice 100 volts with an output impedance of 200 ohms or twice 200 ohms respectively. The transmission was constant from 0 to a few times 100,000 cycles per second and decreased by 3 db at 300,000 cycles per second. The direct voltage input impedance was determined only by the grid current (of the order of 0.01 microampere) of the first tube of the main amplifier.

The amplification remained constant and the linearity was satisfactory for all transmitted frequencies and excellent for low frequencies. For such frequencies, any deviations from the linear relationship between the input and output voltages were as a matter of fact corrected in the same manner as the drift component of the output voltage, so that they remained below 1% up to 100 volts output voltage.

Figure 6:
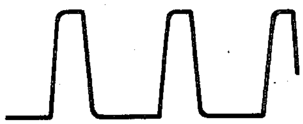
Fig. 6 is a graphic illustration of the output voltage obtained by means of a practical embodiment of the circuit arrangement of the present invention for positive input pulses with a duration of 4 microseconds.

Fig. 6 shows an oscillogram of the output voltage of this practical embodiment of the invention for input pulses of a duration of 4 microseconds and a repetition frequency of 70,000 cycles per second. The output amplitude was 80 volts and was still exactly the same as with a signal frequency of 70 or 1000 cycles per second. No interference could be perceived with a signal frequency equal to the working frequency $f_0$ of the converter.

While the invention has been described by means of a specific example and in specific embodiments, I do not wish to be limited thereto, for obvious modifications will occur to those skilled in the art without departing from the spirit and scope of the invention.

What is claimed is:

1. A stabilized direct and alternating voltage amplifier circuit arrangement comprising a conductively coupled main amplifier having an input and an output, means for applying a first input voltage to the input of said main amplifier, an input network for deriving a second voltage from said first voltage, means for deriving a third output voltage from the output of said main amplifier, an output network for deriving a fourth voltage from said third voltage, control means for periodically comparing said second and fourth voltages thereby to produce a fifth resultant correction voltage and for rectifying an alternating voltage applied thereto, said fifth voltage being substantially proportional in magnitude to the drift component of said third voltage, said input and output networks having substantially equal frequency response characteristics whereby said second and fourth voltages are substantially in phase with each other and the amplitude of said fifth voltage is substantially independent of said first voltage, alternating voltage amplifying means having an input, an output and at least one amplifying stage, said amplifying stage comprising an amplifying device having an input electrode and at least two other electrodes, means for applying said fifth voltage to the input electrode of said amplifying device, means for deriving variations of said fourth voltage, means for applying variations of said fourth voltage to one of said other electrodes of said amplifying device in counteracting direction with respect to variations of said fifth voltage applied to said input electrode of said amplifying device whereby said amplifying means becomes substantially insensitive to variations of said first voltage, means for deriving a sixth amplified correction voltage from the output of said amplifying means, means for applying said sixth voltage to a selected point of said control means thereby to rectify the said sixth voltage, and means for applying the rectified sixth voltage to a selected point in said main amplifier with a polarity opposed to that of said drift component whereby the said drift component is reduced substantially proportionally to the amplification factor of said amplifying means, said input and output networks having a time constant which is large relative to the fundamental frequency of said fifth voltage thereby reducing to a very small value the transmission of relatively rapid variations of said first voltage to the input of said amplifying means and reducing to a very small value the transmission of said fifth voltage to the input of said main amplifier.

2. A stabilized direct and alternating voltage amplifier circuit arrangement, comprising a conductively coupled main amplifier having an input and an output, said main amplifier including amplification control means and variable voltage dividing means coupled to said amplification control means, means for applying a first input voltage to the input of said main amplifier, an input network for deriving a second voltage from said first voltage, means for deriving a third output voltage from the output of said main amplifier, means for deriving a fourth voltage from said third voltage, said last-mentioned means comprising an output network and said variable voltage dividing means whereby said fourth voltage is determined in accordance with the amplification factor of said main amplifier thereby producing substantially no variation of the zero output voltage of said main amplifier upon variation of the amplification factor thereof, control means for periodically comparing said second and fourth voltages thereby to produce a fifth resultant correction voltage and for rectifying an alternating voltage applied thereto, said fifth voltage being substantially proportional in magnitude to the drift component of said third voltage, said input and output networks having substantially equal frequency response characteristics whereby said second and fourth voltages are substantially in phase with each other and the amplitude of said fifth voltage is substantially independent of said first voltage, alternating voltage amplifying means having an input, an output and at least one amplifying stage, said amplifying stage comprising an amplifying device having an input electrode and at least two other electrodes, means for applying said fifth voltage to the input electrode of said amplifying device, means for deriving variations of said fourth voltage, means for applying variations of said fourth voltage to one of said other electrodes of said amplifying device in counteracting direction with respect to variations of said fifth voltage applied to said input electrode of said amplifying device whereby said amplifying means becomes substantially insensitive to variations of said first voltage, means for deriving a sixth amplified correction voltage from the output of said amplifying means, means for applying said sixth voltage to a selected point of said control means thereby to rectify the said sixth voltage, and means for applying the rectified sixth voltage to a selected point in said main amplifier with a polarity opposed to that of said drift component whereby the said drift component is reduced substantially proportionally to the amplification factor of said amplifying means, said input and output networks having a time constant which is large relative to the fundamental frequency of said fifth voltage thereby reducing to a very small value the transmission of relatively rapid variations of said first voltage to the input of said amplifying means and reducing to a very small value the transmission of said fifth voltage to the input of said main amplifier.

3. A stabilized direct and alternating voltage amplifier circuit arrangement, comprising a conductively coupled main amplifier having an input and an output, said main amplifier including amplification control means and variable voltage dividing means coupled to said amplification control means, means for applying a first input voltage to the input of said main amplifier, an input network for deriving a second voltage from said first voltage, means for deriving a third output voltage from the output of said main amplifier, means for deriving a fourth voltage from said third voltage, said last-mentioned means comprising an output network and said variable voltage dividing means whereby said fourth voltage is determined in accordance with the amplification factor of said main amplifier thereby producing substantially no variation of the zero output voltage of said main amplifier upon variation of the amplification factor thereof, control means for periodically comparing said second and fourth voltages thereby to produce a fifth resultant correction voltage and for rectifying an alternating voltage applied thereto, said fifth voltage being substantially proportional in magnitude to the drift component of said third voltage, said input and output networks having substantially equal frequency response characteristics whereby said second and fourth voltages are substantially in phase with each other and the amplitude of said fifth voltage is substantially independent of said first voltage, alternating voltage amplifying means having an input, an output and at least one amplifying stage, said amplifying stage comprising an amplifying device having a control grid and a cathode, means for applying said fifth voltage to said control grid of said amplifying device, means for deriving variations of said fourth voltage, means for applying variations of said fourth voltage to said cathode of said amplifying device in counteracting direction with respect to variations of said fifth voltage applied to said control grid of said amplifying device whereby said amplifying means becomes substantially insensitive to variations of said first voltage, means for deriving a sixth amplified correction voltage from the output of said amplifying means, means for applying said sixth voltage to a selected point of said control means thereby to rectify the said sixth voltage, and means for applying the rectified sixth voltage to a selected point in said main amplifier with a polarity opposed to that of said drift component whereby the said drift component is reduced substantially proportionally to the amplification factor of said amplifying means, said input and output networks having a time constant which is large relative to the fundamental frequency of said fifth voltage thereby reducing to a very small value the transmission of relatively rapid variations of said first voltage to the input of said amplifying means and reducing to a very small value the transmission of said fifth voltage to the input of said main amplifier.

References Cited in the file of this patent

UNITED STATES PATENTS

| | | |
|---|---|---|
| 2,684,999 | Goldberg et al. | July 27, 1954 |
| 2,709,205 | Colls | May 24, 1955 |
| 2,714,136 | Greenwood, Jr. | July 26, 1955 |